United States Patent
Xavier et al.

(10) Patent No.: US 10,084,466 B1
(45) Date of Patent: Sep. 25, 2018

(54) TOP PLATE SAMPLING CIRCUIT INCLUDING INPUT-DEPENDENT DUAL CLOCK BOOST CIRCUITS

(71) Applicant: TEXAS INSTRUMENTS INCORPORATED, Dallas, TX (US)

(72) Inventors: Ani Xavier, Kottayam (IN); Neeraj Shrivastava, Bangalore (IN); Arun Mohan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/856,185

(22) Filed: Dec. 28, 2017

(51) Int. Cl.
  *H03M 1/10* (2006.01)
  *H03M 1/12* (2006.01)
  *G06F 1/04* (2006.01)

(52) U.S. Cl.
  CPC ............ *H03M 1/1245* (2013.01); *G06F 1/04* (2013.01)

(58) Field of Classification Search
  CPC .. H03M 1/1245; H03M 1/0863; H03M 1/002; H03M 1/0845; H03M 3/496
  USPC ................. 341/122, 118, 120, 155
  See application file for complete search history.

(56) References Cited

U.S. PATENT DOCUMENTS

| | | | | |
|---|---|---|---|---|
| 8,854,085 B1* | 10/2014 | Francis | ............... | H03M 1/1245 327/337 |
| 2003/0080800 A1* | 5/2003 | Kuttner | ..................... | H03F 1/34 327/408 |
| 2003/0122612 A1* | 7/2003 | Kawai | ................... | H02M 3/073 327/536 |
| 2005/0073351 A1* | 4/2005 | Ko | ........................ | H03F 3/005 327/337 |
| 2005/0206432 A1* | 9/2005 | Tobita | ..................... | G09G 3/20 327/333 |
| 2011/0018589 A1* | 1/2011 | Lee | ....................... | G11C 27/024 327/94 |
| 2011/0018751 A1* | 1/2011 | Lee | ....................... | G11C 27/024 341/122 |
| 2011/0304492 A1* | 12/2011 | Mandal | ................... | H03M 1/06 341/150 |
| 2012/0218133 A1* | 8/2012 | Thirunakkarasu | ......................... | H03K 17/04123 341/141 |
| 2013/0032691 A1* | 2/2013 | Cho | .................. | H01L 27/14609 250/206 |
| 2013/0335055 A1* | 12/2013 | Ceballos | ............. | H03F 3/45475 323/311 |

(Continued)

*Primary Examiner* — Linh Nguyen
(74) *Attorney, Agent, or Firm* — John R. Pessetto; Charles A. Brill; Frank D. Cimino

(57) ABSTRACT

In some examples, a system includes a first transistor comprising a first source terminal coupled to a first input terminal, a first drain terminal coupled to a first top plate sampling capacitor, and a first gate terminal. The system also includes a first input-dependent dual clock boost circuit coupled to the first input terminal via a first boost circuit input and to the first gate terminal via a first boost circuit output. The system further includes a second transistor comprising a second source terminal coupled to a second input terminal, a second drain terminal coupled to a second top plate sampling capacitor, and a second gate terminal. The system also includes a second input-dependent dual clock boost circuit coupled to the second input terminal via a second boost circuit input and to the second gate terminal of the second transistor via a second boost circuit output.

15 Claims, 3 Drawing Sheets

(56) References Cited

U.S. PATENT DOCUMENTS

2014/0253353 A1* 9/2014 Singer ................. H03M 1/0836
      341/122
2017/0331488 A1* 11/2017 Lee ..................... H03M 1/1245

* cited by examiner

TOP PLATE SAMPLING CIRCUIT INCLUDING INPUT-DEPENDENT DUAL CLOCK BOOST CIRCUITS

BACKGROUND

An analog to digital (A/D) converter is often used in a wireless communication device (e.g., a base station) to convert an analog signal to a digital signal. In some cases, an A/D converter may be used in a device that converts an input signal (e.g., voltage or current) to a digital number proportional to the magnitude of the input signal.

SUMMARY

According to an example, a system includes a first transistor comprising a first source terminal coupled to a first input terminal, a first drain terminal coupled to a first top plate sampling capacitor, and a first gate terminal. The system also includes a first input-dependent dual clock boost circuit coupled to the first input terminal via a first boost circuit input and to the first gate terminal via a first boost circuit output. The system further includes a second transistor comprising a second source terminal coupled to a second input terminal, a second drain terminal coupled to a second top plate sampling capacitor, and a second gate terminal. The system also includes a second input-dependent dual clock boost circuit coupled to the second input terminal via a second boost circuit input and to the second gate terminal of the second transistor via a second boost circuit output.

According to another example, a sample and hold circuit (SH circuit) includes a sample stage circuit, comprising a first transistor comprising a first source terminal coupled to a first input terminal, a first drain terminal coupled to a first top plate sampling capacitor, and a first gate terminal. The sample stage circuit also includes a second transistor comprising a second source terminal coupled to a second input terminal, a second drain terminal coupled to a second top plate sampling capacitor, and a second gate terminal. The sample stage circuit also includes a first input-dependent dual clock boost circuit coupled to the first input terminal via a first boost circuit input and to the first gate terminal via a first boost circuit output, the first input-dependent dual clock boost circuit comprising at least one capacitor configured to provide a first boost voltage to the first gate terminal. The sample stage circuit also includes a second input-dependent dual clock boost circuit coupled to the second input terminal via a second boost circuit input and to the second gate terminal via a second boost circuit output, the second input-dependent dual clock boost circuit comprising at least one capacitor configured to provide a second boost voltage to the second gate terminal. The SH circuit further includes a hold stage circuit, comprising a first amplifier transistor coupled to the first top plate sampling capacitor. The hold stage circuit also includes a second amplifier transistor coupled to the second top plate sampling capacitor.

BRIEF DESCRIPTION OF THE DRAWINGS

For a detailed description of various examples, reference will now be made to the accompanying drawings in which.

DETAILED DESCRIPTION

Figure 1:
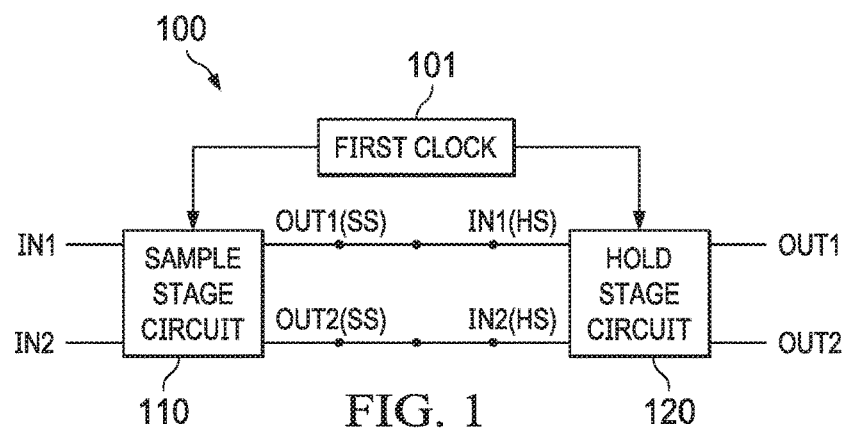
FIG. 1 is a block diagram of an illustrative sample and hold circuit, in accordance with various examples.

A common application of a sample-and-hold (SH) circuit is to maintain the input to an A/D converter at a constant value. Thus, it is desirable for an SH circuit to introduce minimal noise/distortion so that a high-resolution signal is output from the A/D converter. An SH circuit may be divided into a sample stage circuit and a hold stage circuit, with the sample stage and hold stage circuits coupled serially. Stated another way, the sample stage and the hold stage circuits may be connected such that the output of the sample stage circuit may act as an input to the hold stage circuit. Distortions in an SH circuit may be introduced from either the sample stage circuit and/or the hold stage circuit. In some cases, the sample stage circuit employs a sampling switch that may sample (or track) a capacitor up to a sampling voltage and the hold stage circuit may employ an amplifier with transistor that act on the sampled input. Accordingly, the output of the SH circuit, at least in part, may depend on the input of the hold stage circuit (or the output of the sample stage circuit). The input of the hold stage circuit is sometimes referred to herein as the hold stage input.

Typically, a bottom plate sampling technique is used in the sample stage circuit. The bottom plate sampling technique includes a sampling capacitor that is coupled, in series, with the sampling switch and the hold stage circuit, i.e., the sampling capacitor has one plate coupled to the sampling switch (referred to herein as "bottom plate") and the other plate, at least in part, coupled to the hold stage circuit. Typically, the hold stage input is prone to signal attenuation due to the presence of parasitic capacitance in the hold stage circuit, thereby resulting in a low signal to noise ratio (SNR). It may be desirable for the input of the hold stage circuit to be highly linear for a large range of distortion, which, in turn, results in a high resolution digital output from the A/D converter. On the contrary, in some cases, a top plate sampling technique may be used as an alternative to bottom plate sampling at the sample stage circuit. The top plate sampling technique includes a sampling capacitor that is coupled in parallel to the sampling switch and the hold stage circuit, i.e., the sampling capacitor has one plate coupled both to the sampling switch and the hold stage circuit. This plate is sometimes referred to herein as "top plate." The other plate in the top plate sampling may be coupled to ground. The parallel connection results with the input parasitic distortions to be a part of the top plate sampling itself, thereby making it less susceptible to the presence of the input parasitics and resulting in an improved signal to noise ratio (relative to bottom plate sampling). However, the top plate sampling technique is vulnerable to implementation issues. For instance, since the top plate is directly connected to the sampling switch, the hold stage input may be exposed to a third-degree harmonic distortion and a sampling induced distortion. In some cases, an input signal dependent boost circuit may be used to turn on and/or off the sampling switch. The boost circuit may provide a boost voltage to the sampling switch that may offset the distortion (or swing) in the input signal. Thus, the input dependent boost circuitry provides the sampling switch a boost voltage (or an overdrive voltage) that makes the sampling switch resistance, at least in part, independent of the input signal swing and/or distortions. The typical boost circuit employs a single clock in the boost circuit that works in synchrony with the sample and hold clock. However, using a single clock may introduce additional distortions, such as signal leakage from the boost circuit to the sampling capacitor. This signal leakage may distort the hold stage input. In some cases, the boost circuit may also introduce differential and/or common mode disturbance to the hold stage input. Furthermore, in some cases, the hold stage circuit may also introduce some distortions to the hold stage input. The hold stage circuit, during operation, swings from a hold stage input value to a residue value. During the swing, the hold stage input may modulate as a function of the residue value.

As noted above, the input of the hold stage circuit is prone to distortions from both the sample stage circuit and the hold stage circuit. Although the top plate sampling technique is susceptible to the aforementioned issues, its superior SNR performance makes it an attractive alternative to the bottom plate sampling technique. Accordingly, at least some of the examples in this disclosure are directed to a sample and hold circuit that utilizes a top plate sampling technique in the sample stage and employs transistor amplifiers at the hold stage. In particular, the top plate sampling technique described in this disclosure utilizes an input dependent dual clock boost circuit that introduces fewer distortions to the hold stage input. Furthermore, the sample stage disclosed herein utilizes differential and common mode cancellation techniques to further cancel out any differential and/or common mode disturbance. The disclosure also describes using hold stage capacitive coupling to cancel out the distortion that may be introduced when the hold stage circuit swings from a hold stage input value to a residue value.

FIG. 1 is a block diagram of an illustrative SH circuit 100 in accordance with various examples. The SH circuit 100 includes a sample stage circuit 110 and a hold stage circuit 120. The sample stage circuit 110 is configured to receive a differential analog input IN1 and IN2, and the hold stage circuit 120 is configured to generate the hold outputs OUT1 and OUT2. In some examples, IN1 and IN2 are balanced inputs, i.e., they have the same amplitude and opposite phase. In some examples, OUT 1 and OUT 2 are hold signals corresponding to the input signals IN1 and IN2, respectively. The sample and the hold stage circuits 110, 120 are connected serially, i.e., the outputs OUT1(SS) and OUT2(SS) of the sample stage circuit 110 may act, at least in some part, as the inputs IN1(HS) and IN2(HS) to the hold stage circuit 120. The sample stage circuit 110 may also include a first top plate sampling capacitor (not shown) coupled to a first sampling switch (not shown) periodically receiving the input IN1. The sample stage circuit 110 may also include a second top plate sampling capacitor (not shown) coupled to a second sampling switch (not expressly shown) periodically receiving the input IN2.

The SH circuit 100 may receive and sample the inputs IN1, IN2 at a frequency determined by a first clock signal 101. In some examples, the SH circuit 100 may perform the sample and hold operation in synchrony to the first clock signal 101. The operation includes a sample period and a hold period. In some examples, the first clock signal 101 may drive some of the components (not shown) of the sample stage circuit 110 and the hold stage circuit 120. During the sample period of the first clock signal 101, the first and the second sampling switches (shown in FIG. 2(*a*)) may be closed and the inputs IN1 and IN2 may charge the first and the second top plate sampling capacitors (respectively). In some examples, the SH circuit 100 may also include one or more input-dependent boost circuits, which may reduce the distortions caused by the sampling switches at the top plate sampling capacitors. As noted above, in some cases, the boost circuits employ a single clock in the boost circuit that works in synchrony with the first clock signal 101, such that the boost circuit provides input dependent boost voltage to the first and second sampling switches (not shown) during the sample period and the boost circuit charges itself to the boost voltage during the hold period. However, using a boost circuitry working on a single clock may introduce additional distortions. In some cases, a signal may leak from the boost circuit to the top plate sampling capacitors, which may distort the hold stage input signals IN1 (HS), IN2 (HS). Therefore, the sample stage circuit 110 includes first and second boost circuits (not shown) that provide first and second boost voltages to the first and second sampling switches (respectively) using a dual clock system. In some examples, using the dual clock system may prevent the signal leakage from the boost circuits to the top plate sampling capacitors.

In some examples, due to parasitic capacitance of the first and the second sampling switches, there may be some clock feedthrough, which may further cause attenuation at the first and second top plate sampling capacitors. As further described below, to prevent this attenuation, the sample stage circuit 110 may implement a differential mode cancellation technique to cancel out this attenuation caused by the clock feedthrough. In some examples, a common mode disturbance may also exist due to clock feedthrough. To alleviate the common mode disturbance, as further described below, sample stage circuit 110 may implement a differential mode cancellation technique to cancel out this common mode distortion. As further described below, the SH circuit 100 also includes using hold stage device capacitors to cancel out the distortion that may be introduced during the hold phase of the first clock signal 101.

FIG. 2(*a*) is a circuit schematic diagram of the illustrative SH circuit 100 of FIG. 1. FIG. 2(*a*) depicts the sample stage circuit 110, the hold stage circuit 120, and the first clock signal 101. The sample stage circuit 110 includes a first top plate capacitor 185 and a second top plate capacitor 195. The sample stage circuit 110 further includes a first sampling switch 180 and a second sampling switch 190. The first sampling switch includes a source terminal 180(S) that is configured to receive the first input IN1, a drain terminal 180(D) that couples to the first top plate sampling capacitor 185 at the node 186, and a gate terminal 180(G). The second sampling switch includes a source terminal 190(S) that is configured to receive the second input IN2, a drain terminal 190(D) that couples to the second top plate sampling capacitor 195 at the node 196, and a gate terminal 190(G). In some examples, the sampling stage circuit 110 may also include a first input-dependent dual clock boost circuit 160 and a second input-dependent dual clock boost circuit 170. The input I160 of the first input-dependent dual clock boost circuit 160 may be coupled to the node 140 such that the first input-dependent dual clock boost circuit 160 is configured to receive the input IN1. The output O160 of the first input-dependent dual clock boost circuit 160 is coupled to the gate terminal 180(G). Similarly, the input I170 of the second input-dependent dual clock boost circuit 170 may be coupled to the node 150 such that the second input-dependent dual clock boost circuit 170 is configured to receive the input IN2. The output O170 of the second input-dependent dual clock boost circuit 170 is coupled to the gate terminal 190(G).

The sample stage circuit 110 may also include an attenuation cancellation capacitor 181 to eliminate an attenuation that may be introduced by the first input-dependent dual clock boost circuit 160 (through the intrinsic capacitance of the first sampling switch 180). Similarly, the sample stage circuit 110 may also include an attenuation cancellation capacitor 191 to eliminate an attenuation that may be introduced by the second input-dependent dual clock boost circuit 170 (through the intrinsic capacitance of the second sampling switch 190). The attenuation cancellation capacitor 181 may be differentially connected between the output O160 and the drain terminal 190(D). Similarly, the attenuation cancellation capacitor 191 may be differentially connected between the output O170 and to the drain terminal 180(D). The sample stage circuit 110 may further include common mode cancellation (or common mode) capacitors 182, 192 that are serially connected at 184. One plate of the common mode cancellation capacitor (or common mode capacitor) 182 is coupled to the drain terminal 180(D) at the node 183. The common mode cancellation capacitor (or common mode capacitor) 192 is coupled to the drain terminal 190(D) at the node 193. As further described below, the sample stage circuit 110 also includes a second clock signal 102 and a third clock signal 103, each of which drives both the first input-dependent dual clock boost circuit 160 and the second input-dependent dual clock boost circuit 170.

As noted above, the SH circuit 100 of FIG. 2(a) also includes the hold stage circuit 120, which further includes amplifiers 200, 210 that generates output signals out1 and out2, respectively. The amplifier 200 includes an amplifier transistor 205, which further includes a source terminal 205(S), a drain terminal 205(D), and a gate terminal 205(G). Similarly, the amplifier 210 includes an amplifier transistor 215, which further includes a source terminal 215(S), a drain terminal 215(D), and a gate terminal 215(G). The gate terminal 205(G) is coupled to the node 186 and the gate terminal 215(G) is coupled to the node 196. The source terminal 205(S) couples the drain terminal 205(D) via the capacitors 201 and 202. In some examples, the capacitance of the capacitor 201 may be substantially equal to the capacitance between the gate terminal 205(G) and source terminal 205(S). In some examples, the capacitance of the capacitor 202 may be substantially equal to the capacitance between the gate terminal 205(G) and drain terminal 205(D). Similarly, the source terminal 215(S) and the drain terminal 215(D) via the capacitors 211 and 212. In some examples, the capacitance of the capacitor 211 may be substantially equal to the capacitance between the gate terminal 215(G) and source terminal 215(S). In some examples, the capacitance of the capacitor 212 may be substantially equal to the capacitance between the gate terminal 215(G) and drain terminal 215(S). The capacitors 201, 202 may be employed to mitigate a disturbance that the hold stage circuit 120 may induce on the top plate sampling capacitor 185 when amplifier 200 output swings from the sample period to hold period. Similarly, the capacitors 211, 212 may be employed to mitigate a disturbance that the hold stage circuit 120 may induce on the top plate sampling capacitor 195 when amplifier 210 swings from the sample period to hold period.

Figure 2B:
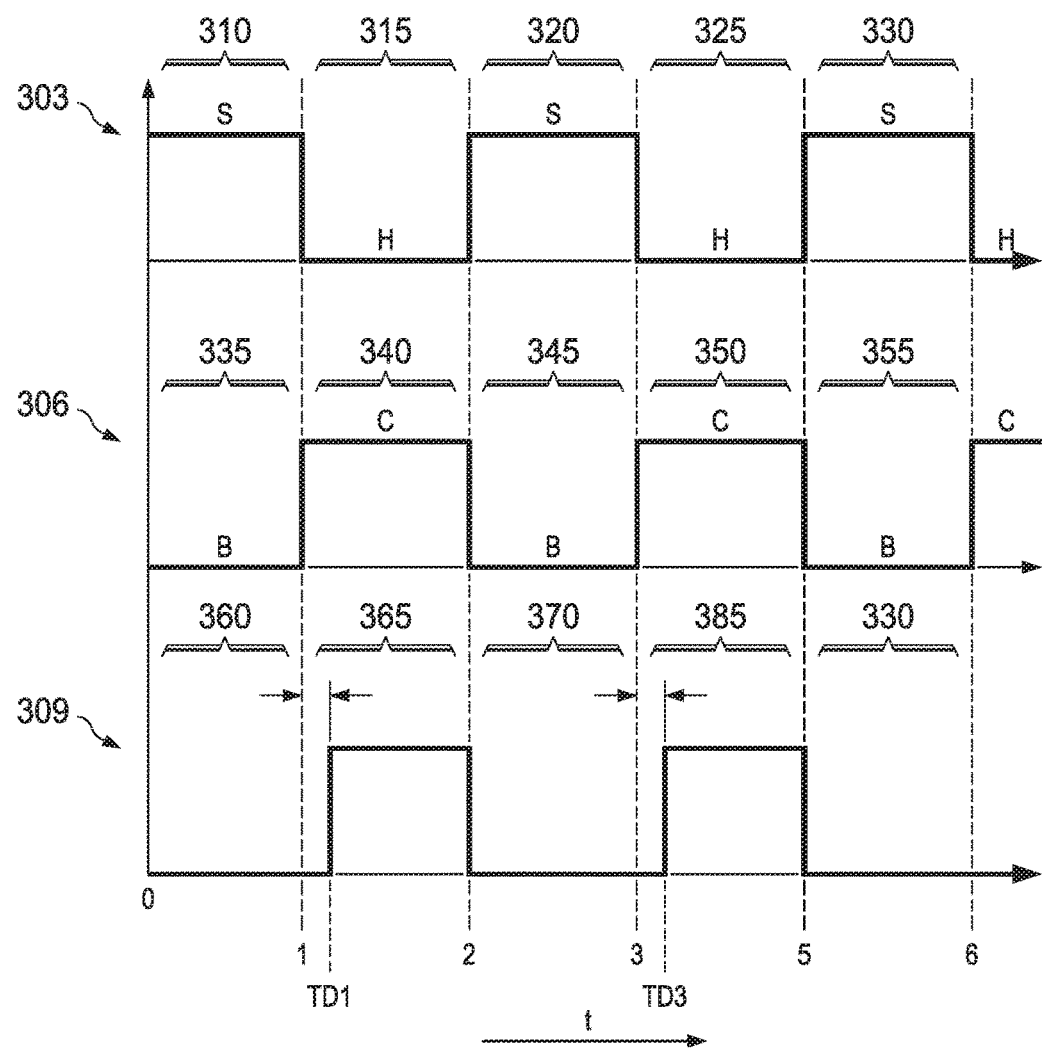
FIG. 2(b) is a timing diagram in accordance with various examples.
Figure 2A:
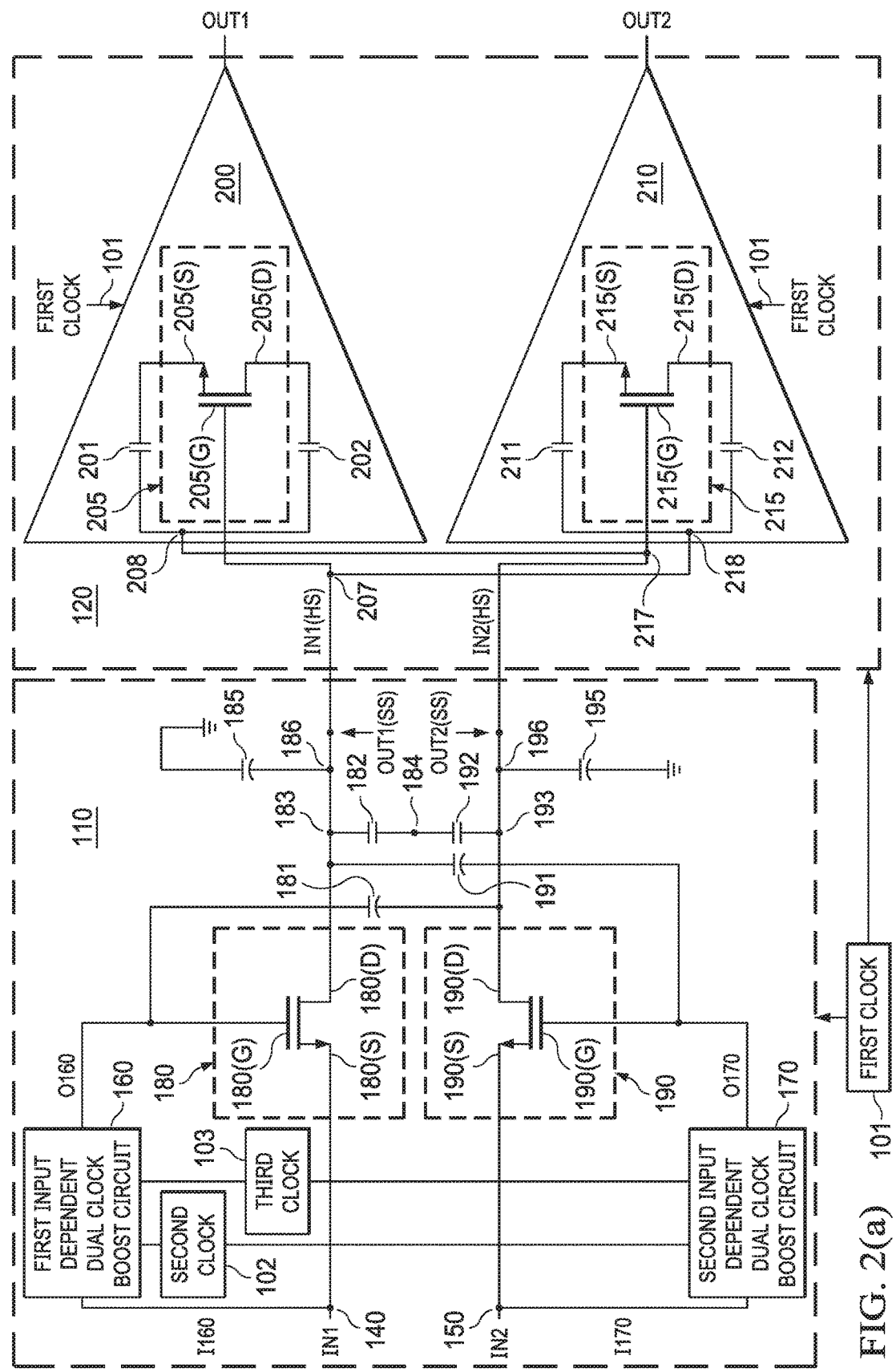
FIG. 2(a) is a circuit schematic diagram of the illustrative sample and hold circuit of FIG. 1, in accordance with various examples.

Referring now to FIG. 2(b), the timing diagrams 303, 306, and 309 of the first clock signal 101, the second clock signal 102, and the third clock signal 103 (respectively) are depicted. The timing diagram 303 depicts the sample periods 310, 320, and 330. The timing diagram 303 depicts the hold periods 315 and 325. The operation of the first clock signal 101 (timing diagram 303) is now described in tandem with FIG. 2(a). For simplicity's sake, this operation is described from t=0 to t=3 (FIG. 2(b)). At the sample period 310, the sampling switches 180, 190 may be closed, i.e., the input signal IN1 may flow through the switch 180 to charge the first top plate capacitor 185 and the input signal IN2 may flow through the switch 190 to charge the second top plate capacitor 195. During the sample period 310, the output signal OUT1(SS) may be generated across the top plate sampling capacitor 185 and OUT2(SS) may be generated across the top plate sampling capacitor 195. At the hold period 315, the first sampling switch 180 and the second sampling switch 190 may be open, i.e., approximately no signal flows through them. During the hold period 315, the amplifier transistors 205, 215 may receive OUT1(SS) and OUT2(SS) as inputs IN1(HS) and IN2(HS), respectively. Further, during the hold period 315, the inputs IN1(HS) and IN2(HS) may be provided to the gates 205(G) and 215(G), respectively. In some examples, as further described below, some measures may be taken to open the switches 180, 190 at the hold period 315. Similar to the sample period 310, at the sample period 320, the first and second sampling switches 180, 190 are closed, and this further facilitates charging the top plate sampling capacitors 185, 195 respectively.

During the sample periods 310, 320, 330, in some examples, the resistance of the sampling switches 180, 190 may depend on the first input IN1 and second input IN2 (respectively) and the signal provided at the gate terminals 180(G) and 190(G) (respectively). There may be cases where due to some distortion in the input signals IN1, IN2, the resistance of the sampling switches 180, 190 may vary. However, an increased switch resistance may affect the performance of the sampling switches 180, 190. It is desired to have switch resistance that is independent of distortions in the input signals IN1, IN2. In some examples, as described below, this independence may be achieved by providing a boost voltage to the sampling switches. In some examples, an input dependent boost voltage may be provided to both the sampling switches 180, 190 at their gate terminals 180(G), 190(G), which may ensure that the switch resistance of the sampling switches 180, 190 is substantially constant (within 1-10% of the switch resistance). The first input-dependent dual clock boost circuit 160 provides an input dependent boost voltage to the sampling switch 180 and the second input-dependent dual clock boost circuit 170 provides input dependent boost voltage to the sampling switch 190. The circuits 160, 170 may be termed input-dependent, because the boost voltage transmitted from the circuits 160, 170 to the sampling switches 180, 190 may depend on receiving the first and second input signals IN1 and IN2, respectively. FIG. 2(b) further shows the timing diagram 306 of the injection of the boost voltage. The timing diagram 306 includes the boost periods 335, 345, and 355, i.e., the periods in which the first and second input-dependent dual clocks boost circuits 160, 170 inject a boost voltage at the gate terminals 180(G), 190(G) respectively. The timing diagram 306 also includes the charge periods 340 and 350, in which the first and second input-dependent dual clocks boost circuits 160, 170 charges to the boost voltage.

Figure 2C:
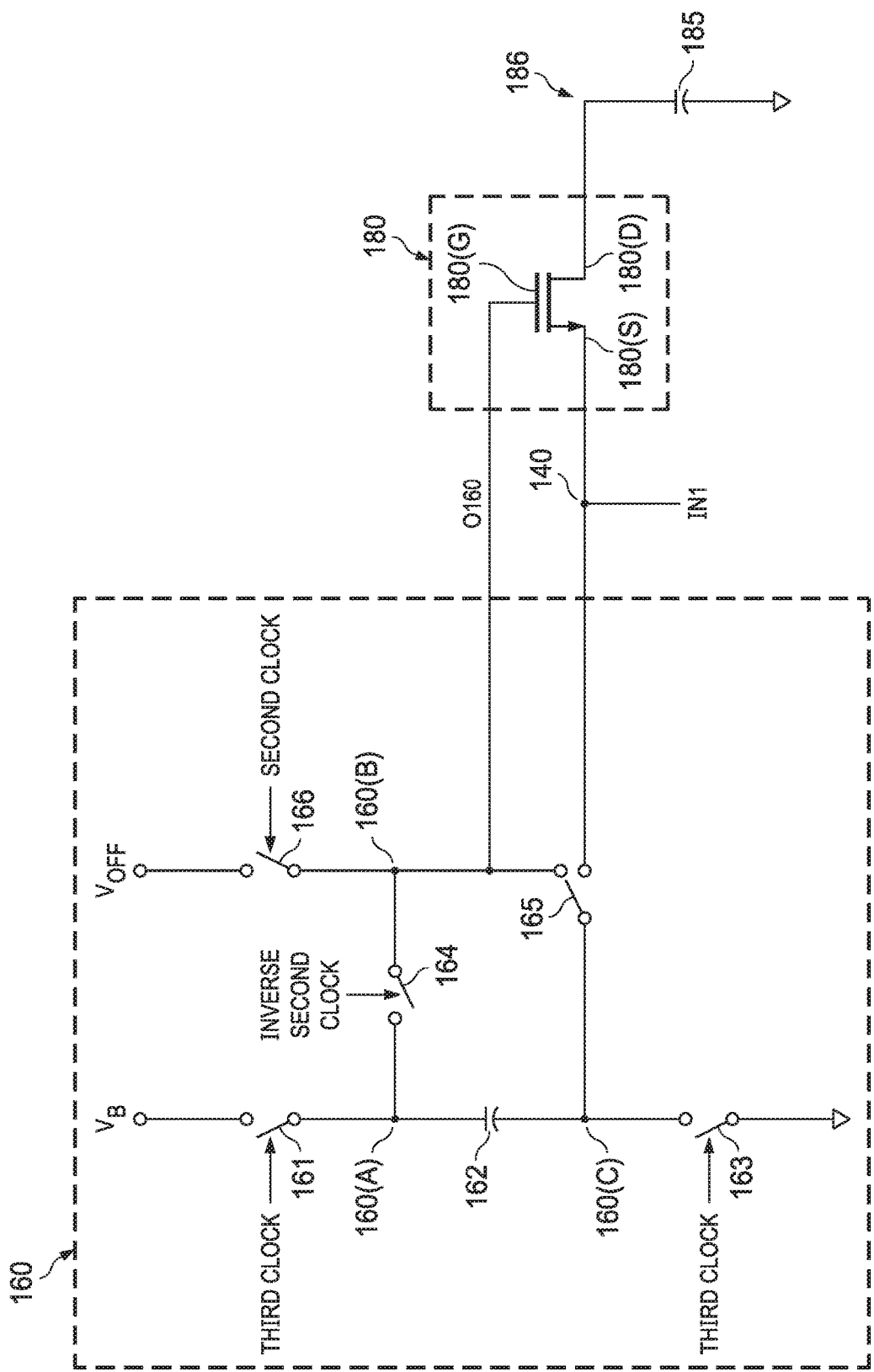
FIG. 2(c) is a circuit schematic diagram of an illustrative first input-dependent dual clock boost circuit, in accordance with various examples.

Now referring to FIG. 2(c), an illustrative first input-dependent dual clock boost circuit 160 includes a switch 164 that may be driven by an inverse second clock. In some examples, the timing diagram of an inverse second clock may be similar to the timing diagram of the first clock signal 101. The first input-dependent dual clock boost circuit 160 also includes a switch 166 that is controlled by the second clock signal 102, such that when the second clock signal 102 is in boost periods 335, 345, and 355, the switch 166 is open.

When the second clock signal 102 is in charge periods 340, 350, the switch 166 is closed. The switch 166 couples to a connection that is configured to receive an off state voltage $V_{OFF}$ from a voltage source (not shown). The first input-dependent dual clock boost circuit 160 further includes a connection to receive a boost voltage $V_B$ from a voltage source (not shown), where $V_B$ is provided to a switch 161 that is controlled by the third clock signal 103. The other end of the switch 161 connects to a boost capacitor 162, which further couples to a switch 163 that is also controlled by the third clock signal 103. The other end of the switch 163 couples to ground. The switches 161, 164, and the capacitor 162 couple at a node 160(A). The switches 166, 164, and 165 couple at a node 160(B). The switches 163 and 165 and the capacitor 162 couples at a node 160(C). The first input-dependent dual clock boost circuit 160 also includes a switch 165, which is driven by a voltage at the node 160(B). The node 160(B) couples to the output O160 of the first input-dependent dual clock boost circuit 160 (FIG. 2(a)) and the switch 165 couples to the node 140 that receives the input IN1.

For explanation's sake, assume that the switches present in the single clock in the first input-dependent dual clock boost circuit 160 are controlled by a single clock, such as the second clock signal 102. In this scenario, first input-dependent dual clock boost circuit 160 may introduce additional distortions to the node 186. When the first input-dependent dual clock boost circuit 160 is controlled using a single clock, additional distortions, such as signal leakage from the boost capacitor 162 to the top plate sampling capacitor 185, may occur. For instance, when the boost circuit transitions from the boost period (e.g., 335) to the charge period (e.g., 340), the boost circuit may not completely turn off (i.e., transition from closed state to open state) and some boost voltage may leak into the top plate sampling capacitor 185 during the charge period. This leakage occurs when going from the boost period (e.g., second clock, 335) to the charge period (e.g., second clock, 340). Therefore, this disclosure describes controlling a boost circuit, such as the first input-dependent boost circuit 160, using two clocks, e.g., the second clock signal 102 and the third clock signal 103.

The timing diagram 309 (FIG. 2(b)) and FIG. 2(c) are now described in tandem. For simplicity's sake, the operation of the dual clock system is described from t=0 to t=2. The first input-dependent dual clock boost circuit 160, its corresponding sampling switch 180, and the top plate sampling capacitor 185 are described. Further, only the amplifier transistor 205 (that is coupled to the sampling switch 180) is described. From t=0 to t=1, the sampling switch 180 may be closed. However, as described above, in order to keep the switch resistance independent of input signal, the first input-dependent dual clock boost circuit 160 (functioning in the boost period 335) may provide the gate terminal 180(G) with additional biasing, which facilitates keeping the switch resistance of the sampling switch 180 substantially constant. As noted above, from t=1 to t=2, the sampling switch 180 may be open and the amplifier transistors 205, 215 may perform a hold operation. So, during t=1 to t=2, the third clock signal 103 is in its charge period 365, but it includes a delay of TD1. From t=1 to t=TD1, the switches 161 and 163 remain open. However, from t=TD1 to T=2, the switches 161, 163 are closed and the boost voltage $V_B$ charges the capacitor 162 up to $V_B$. The delay between the charge period 340 of second clock signal 102 and charge period 365 of the third clock signal 103 prevents leakage that may distort the signal at the node 186, which, in turn, prevents distortion of the OUT1 (SS) (or IN1(HS)).

As noted above, the sample stage circuit 110 may further include differential and common mode cancellation techniques to cancel out differential and/or common mode disturbances that may distort the OUT1(SS). In order to cancel a differential disturbance, the sample stage circuit 110 employs a differential coupling technique that includes the capacitors 181 and 191. Additionally, the sample stage circuit 110 may employ a common mode cancellation technique to cancel out common mode disturbances. The SH circuit 100 also includes hold stage device capacitors to cancel out the distortion that may be introduced during the hold phase of the first clock signal 101. This description is not limited to the first input-dependent dual clock boost circuit 160. Similar principles may apply to the second input-dependent dual clock boost circuit 170, such that it injects a separate boost voltage to the node 196 during the charge period 365.

The foregoing discussion, in some examples, utilizes three separate clocks, i.e., the first clock signal 101, the second clock signal 102, and the third clock signal 103. The utilization of the third clock signal 103 may be necessary because it introduces the delay TD1, TD3, etc. However, the timing diagram of the first clock signal 101 may be replicated by inverting the second clock signal 102 and vice versa. Therefore, from an implementation standpoint, the foregoing discussion may be valid for two clocks.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Additionally, uses of the phrase "ground" in the foregoing discussion are intended to include a chassis ground, an Earth ground, a floating ground, a virtual ground, a digital ground, a common ground, and/or any other form of ground connection applicable to, or suitable for, the teachings of the present disclosure.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
   a first transistor comprising a first source terminal coupled to a first input terminal, a first drain terminal coupled to a first top plate sampling capacitor, and a first gate terminal;
   a first input-dependent dual clock boost circuit coupled to the first input terminal via a first boost circuit input and to the first gate terminal via a first boost circuit output;
   a second transistor comprising a second source terminal coupled to a second input terminal, a second drain terminal coupled to a second top plate sampling capacitor, and a second gate terminal; and
   a second input-dependent dual clock boost circuit coupled to the second input terminal via a second boost circuit input and to the second gate terminal of the second transistor via a second boost circuit output;
   a first attenuation cancellation capacitor coupled to the first boost circuit output and the second drain terminal; and a second attenuation cancellation capacitor coupled to the second boost circuit output and the first drain terminal.

2. A system, comprising:
a first transistor comprising a first source terminal coupled to a first input terminal, a first drain terminal coupled to a first top plate sampling capacitor, and a first gate terminal;
a first input-dependent dual clock boost circuit coupled to the first input terminal via a first boost circuit input and to the first gate terminal via a first boost circuit output;
a second transistor comprising a second source terminal coupled to a second input terminal, a second drain terminal coupled to a second top plate sampling capacitor, and a second gate terminal; and
a second input-dependent dual clock boost circuit coupled to the second input terminal via a second boost circuit input and to the second gate terminal of the second transistor via a second boost circuit output;
a first common mode capacitor and a second common mode capacitor serially connected at a common node, wherein a terminal of the first common mode capacitor is coupled to the first drain terminal and a terminal of the second common mode capacitor is coupled to the second drain terminal.

3. A system, comprising:
a first transistor comprising a first source terminal coupled to a first input terminal, a first drain terminal coupled to a first top plate sampling capacitor, and a first gate terminal;
a first input-dependent dual clock boost circuit coupled to the first input terminal via a first boost circuit input and to the first gate terminal via a first boost circuit output;
a second transistor comprising a second source terminal coupled to a second input terminal, a second drain terminal coupled to a second top plate sampling capacitor, and a second gate terminal; and
a second input-dependent dual clock boost circuit coupled to the second input terminal via a second boost circuit input and to the second gate terminal of the second transistor via a second boost circuit output;
wherein the first input-dependent dual clock boost circuit further comprising:
a first clock signal comprising a first boost period and a first charge period, wherein the first clock signal is configured to control a first switch that is coupled to a first voltage node and the first gate terminal; and
a second clock signal comprising a second boost period and a second charge period, wherein the second clock signal is configured to control a second switch and a third switch, wherein the second switch is coupled to a second voltage node and to a first plate of a boost capacitor, a second plate of the boost capacitor is coupled to the third switch, wherein the third switch further couples to ground;
wherein a fourth switch configured to be controlled by a clock signal that is inverse to the first clock signal, wherein a fifth switch configured to be controlled by a signal at a first node wherein one end of the fourth switch is coupled at a second node between the second switch and the first plate of a boost capacitor, and another end of the fourth switch is coupled to a third node between the first switch and the first gate terminal.

4. The system of claim 3, wherein a boost voltage received at the second voltage node is configured to charge the boost capacitor during the second charge period.

5. The system of claim 4, wherein the second charge period is delayed relative to the first charge period.

6. The system of claim 3, wherein the first input-dependent dual clock boost circuit is configured to generate a first boost voltage at the first gate terminal during the first boost period, wherein the second input-dependent dual clock boost circuit is configured to generate a second boost voltage at the second gate terminal during the first boost period.

7. A system, comprising:
a first transistor comprising a first source terminal coupled to a first input terminal, a first drain terminal coupled to a first top plate sampling capacitor, and a first gate terminal;
a first input-dependent dual clock boost circuit coupled to the first input terminal via a first boost circuit input and to the first gate terminal via a first boost circuit output;
a second transistor comprising a second source terminal coupled to a second input terminal, a second drain terminal coupled to a second top plate sampling capacitor, and a second gate terminal; and
a second input-dependent dual clock boost circuit coupled to the second input terminal via a second boost circuit input and to the second gate terminal of the second transistor via a second boost circuit output;
a first amplifier transistor comprising a third source terminal, a third drain terminal, and a third gate terminal, wherein the third gate terminal couples to the first top plate sampling capacitor; and
a second amplifier transistor comprising a fourth source terminal, a fourth drain terminal, and a fourth gate terminal, wherein the fourth gate terminal couples to the second top plate sampling capacitor;
wherein:
the third source terminal and the third drain terminal are connected via a first capacitor and a second capacitor, wherein the first capacitor connects to the second capacitor at a first node; and
the fourth source terminal and the fourth drain terminal are connected via a third capacitor and a fourth capacitor, wherein the third capacitor connects to the fourth capacitor at a second node, wherein the first node couples to the fourth gate terminal and the second node couples to the third gate terminal.

8. A sample and hold circuit (SH circuit), comprising:
a sample stage circuit, comprising:
a first transistor comprising a first source terminal coupled to a first input terminal, a first drain terminal coupled to a first top plate sampling capacitor, and a first gate terminal;
a second transistor comprising a second source terminal coupled to a second input terminal, a second drain terminal coupled to a second top plate sampling capacitor, and a second gate terminal;
a first input-dependent dual clock boost circuit coupled to the first input terminal via a first boost circuit input and to the first gate terminal via a first boost circuit output, the first input-dependent dual clock boost circuit comprising at least one capacitor configured to provide a first boost voltage to the first gate terminal; and
a second input-dependent dual clock boost circuit coupled to the second input terminal via a second boost circuit input and to the second pate terminal via a second boost circuit output, the second input-dependent dual clock boost circuit comprising at least one capacitor configured to provide a second boost voltage to the second gate terminal;

a hold stage circuit, comprising:
  a first amplifier transistor coupled to the first top plate sampling capacitor; and
  a second amplifier transistor coupled to the second top plate sampling capacitor;
wherein:
the first input terminal is configured to receive a first input that is further configured to generate a first sampling voltage across the first top plate sampling capacitor; and
the second input terminal is configured to receive a second input that is further configured to generate a second sampling voltage across the second top plate sampling capacitor.

9. The SH circuit of claim 8, wherein the first and the second inputs are balanced signals.

10. The SH circuit of claim 8, wherein the first input-dependent dual clock boost circuit further comprising:
  a first clock signal comprising a first boost period and a first charge period, wherein the first clock signal is configured to control a first switch that is coupled to a first voltage node and the first gate terminal; and
  a second clock signal comprising a second boost period and a second charge period, wherein the second clock signal is configured to control a second switch and a third switch, wherein the second switch is coupled to a second voltage node and to a first plate of a boost capacitor, a second plate of the boost capacitor is coupled to the third switch, wherein the third switch further couples to ground.

11. The SH circuit of claim 10, wherein a fourth switch configured to be controlled by a clock signal that is inverse to the first clock signal, wherein a fifth switch configured to be controlled by a signal at a first node wherein one end of the fourth switch is coupled at a second node between the second switch and the first plate of a boost capacitor, and another end of the fourth switch is coupled to a third node between the first switch and the first gate terminal.

12. The SH circuit of claim 8, comprising:
  a first attenuation cancellation capacitor coupled to the first boost circuit output and the second drain terminal;
  a second attenuation cancellation capacitor coupled to the second boost circuit output and the first drain terminal; and
  a first common mode capacitor and a second common mode capacitor connected at a common node, wherein a terminal of the first common mode capacitor is coupled to the first drain terminal and a terminal of the second common mode capacitor is coupled to the second drain terminal.

13. The SH circuit of claim 8, wherein the first amplifier transistor comprising a third source terminal, a third drain terminal, and a third gate terminal, wherein the third gate terminal couples to the first top plate sampling capacitor; and
  the second amplifier transistor comprising a fourth source terminal, a fourth drain terminal, and a fourth gate terminal, wherein the fourth gate terminal couples to the second top plate sampling capacitor.

14. The SH circuit of claim 13, wherein:
the third source terminal and the third drain terminal are connected via a first capacitor and a second capacitor, wherein the first capacitor connects to the second capacitor at a first node; and
the fourth source terminal and the fourth drain terminal are connected via a third capacitor and a fourth capacitor, wherein the third capacitor connects to the fourth capacitor at a second node,
wherein the first node couples to the fourth gate terminal and the second node couples to the third gate terminal.

15. The SH circuit of claim 14, wherein the first capacitor is configured to generate a first capacitance that is substantially equal to a capacitance between the third source terminal and the third gate terminal, wherein the second capacitor is configured to generate a second capacitance that is substantially equal to a capacitance between the third drain terminal and the third gate terminal, the third capacitor is configured to generate a third capacitance that is substantially equal to a capacitance between the fourth source terminal and the fourth gate terminal, the fourth capacitor is configured to generate a fourth capacitance that is substantially equal to a capacitance between the fourth drain terminal and the fourth gate terminal.

* * * * *